(12) United States Patent
Lee

(10) Patent No.: US 6,593,225 B1
(45) Date of Patent: Jul. 15, 2003

(54) METHOD OF FORMING A STACKED DIELECTRIC LAYER ON A SEMICONDUCTOR SUBSTRATE HAVING METAL PATTERNS

(75) Inventor: Shyh-Dar Lee, Hsinchu Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/087,773

(22) Filed: Mar. 5, 2002

(51) Int. Cl.$^7$ .......................................... H01L 21/4763
(52) U.S. Cl. ..................... 438/623; 438/624; 438/627; 438/636
(58) Field of Search ................. 438/623, 624, 438/625, 626, 627, 633, 634, 636, 637; 257/750, 751, 760

(56) References Cited

U.S. PATENT DOCUMENTS 5,920,790 A * 7/1999 Wetzel et al. ............... 438/618
6,294,457 B1 * 9/2001 Liu ............................. 438/623
2002/0172811 A1 * 11/2002 Barth et al. ................. 428/209

* cited by examiner

Primary Examiner—Olik Chaudhuri
Assistant Examiner—Hsien Ming Lee
(74) Attorney, Agent, or Firm—Birch, Stewart, Kolasch & Birch, LLP

(57) ABSTRACT

A method of forming a stacked dielectric layer on a semiconductor substrate having metal patterns. A first dielectric layer is formed on the semiconductor substrate. Next, a second dielectric layer is formed on the first dielectric layer to generate a composite dielectric layer. The second dielectric layer has a dielectric constant (k) higher than that of the first dielectric layer, a hardness higher than that of the first dielectric layer, and a thickness less than that of the first dielectric layer. The steps of forming the first dielectric layer and second dielectric layer can be repeated at least 2 to 3 times to form a stacked dielectric layer.

19 Claims, 2 Drawing Sheets

METHOD OF FORMING A STACKED DIELECTRIC LAYER ON A SEMICONDUCTOR SUBSTRATE HAVING METAL PATTERNS

BACKGROUND OF THE INVENTION

1. Field of the Invention

The present invention relates to the manufacture of semiconductor devices, more particularly to a method of forming a stacked dielectric layer on a semiconductor substrate having metal patterns.

2. Description of the Related Art

Low dielectric constant (low k) materials have been widely used in Very Large Scale Integrated (VLSI) and Ultra Large Scale Integrated (ULSI) chips where interconnected wiring capacitance must be minimized.

FIGS. 1 is a cross-section showing the steps of a low k dielectric layer on a semiconductor substrate according to the prior art.

As shown in FIG. 1, a silicon semiconductor substrate 10 is provided. Metal patterns 14, for example of copper, are then formed in an inter-metal-dielectric (IMD) layer 12 followed by the deposition of a sealing layer 16. The dielectric layer 18, having a thickness from 6000 angstroms to about 8000 angstroms is formed on the sealing layer 16 by chemical vapor deposition (CVD) or spin coating. An anti-reflection layer 20 is then deposited on the dielectric layer 18 followed by conventional photolithography. The low k dielectric materials include inorganic materials formed by CVD and organic materials such However, inorganic materials have generally high hardness and relatively high dielectric constant, making them unable to meet requirements when interconnected wiring capacitance must be minimized.

On the other hand, organic materials have generally low hardness, and relatively low dielectric constant, resulting in outgassing during the subsequent annealing process. Moreover, the dielectric constant (k) of the dielectric layer is varied and unstable. Furthermore, one dielectric layer with insufficient hardness may result in cracking during the package assembly process.

SUMMARY OF THE INVENTION

In view of the above disadvantages, an object of the invention is to provide a method of forming a stacked dielectric layer on a semiconductor substrate having metal patterns, thereby eliminating outgassing and cracking.

A further object of the invention is to provide a method of forming a stacked dielectric layer on a semiconductor substrate having metal patterns. This method can meet requirements when interconnected wiring capacitance must be minimized.

Accordingly, the above objects are attained by providing a method of forming a stacked dielectric layer on a semiconductor substrate having metal patterns. A first dielectric layer, having a thickness of 1000 to 1500 angstroms, is formed on the semiconductor substrate. Next, a second dielectric layer, having a thickness of 300 to 500 angstroms, is formed on the first dielectric layer to generate a composite dielectric layer. The second dielectric layer has a dielectric constant (k) higher than that of the first dielectric layer, a hardness higher than that of the first dielectric layer, and a thickness less than that of the first dielectric layer. The steps of forming the first dielectric layer and the second dielectric layer can be repeated at least 2 to 3 times to form a stacked dielectric layer. As well, an anti-reflection layer consisting of silicon oxy-nitride is preferably formed to cover the stacked dielectric layer.

In one embodiment of the invention, the first dielectric layer can be an organic material layer having dielectric constant of 1.5 to 2.7, a hardness from 0.6 Gpa to 1.5 Gpa. Alternately, an inorganic material layer formed by chemical vapor deposition can be used to replace the organic material layer. Moreover, the second dielectric layer can be silicon oxide, silicon nitride, silicon oxy-nitride, silicon carbide, or carbon doped silicon oxide and has a dielectric constant of 3 to 5. Also, the second dielectric layer has a hardness of 3 Gpa to 7 Gpa. Furthermore, the first dielectric layer and second dielectric layer can be formed in the same chemical vapor deposition tool.

The method of may further comprise a step of etching the composite dielectric layer to form a dual damascene structure by conventional via-first technology.

The method may also comprise the adhesion between the first dielectric layer and the second dielectric layer being 70 Mpa to 90 Mpa.

BRIEF DESCRIPTION OF THE DRAWINGS

The preferred embodiment of the invention is hereinafter described with reference to the accompanying drawings in which.

DETAILED DESCRIPTION OF THE INVENTION

Figure 1:
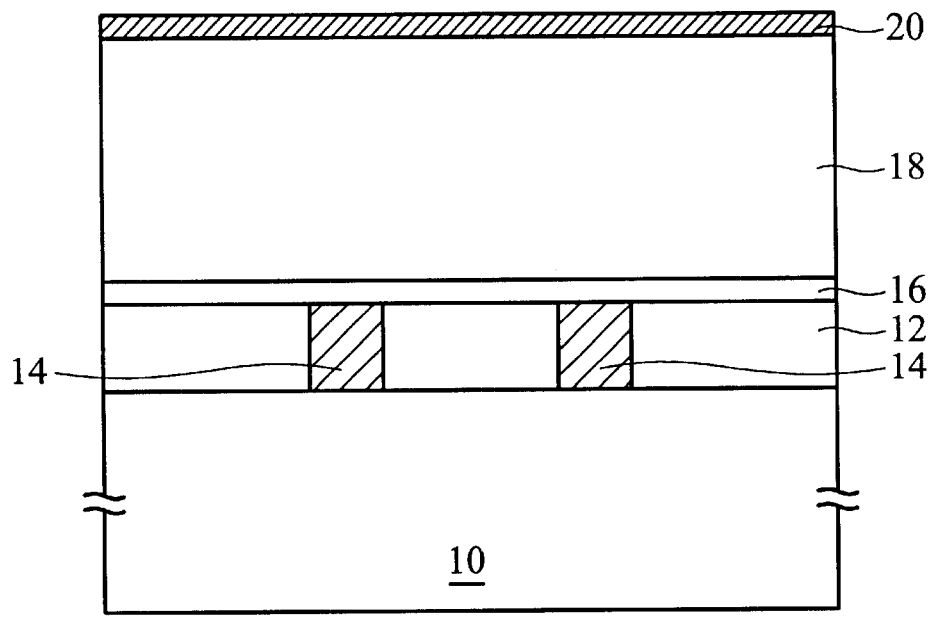
FIGS. 1 is a cross-section showing the steps of forming a dielectric layer on a semiconductor substrate according to the prior art.
Figure 2:
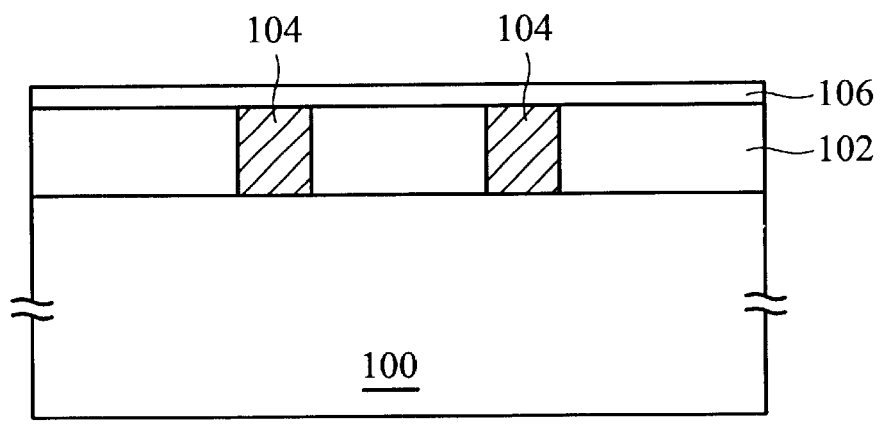
FIG. 2 to FIG. 4 are cross-sections showing the steps of forming a stacked dielectric layer on a semiconductor substrate according to the embodiment of the invention.
Figure 3:
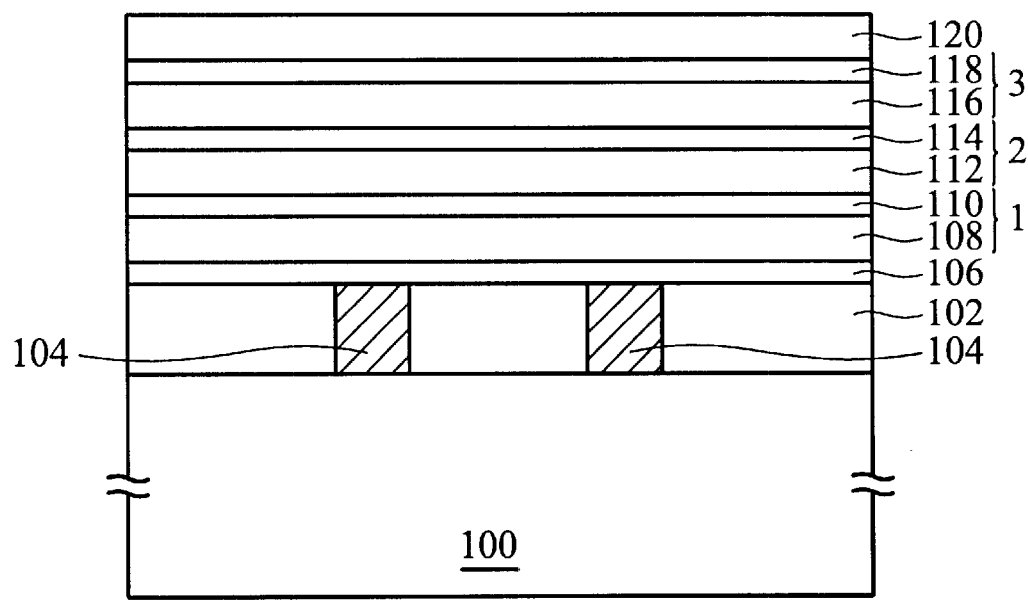
Figure 4:
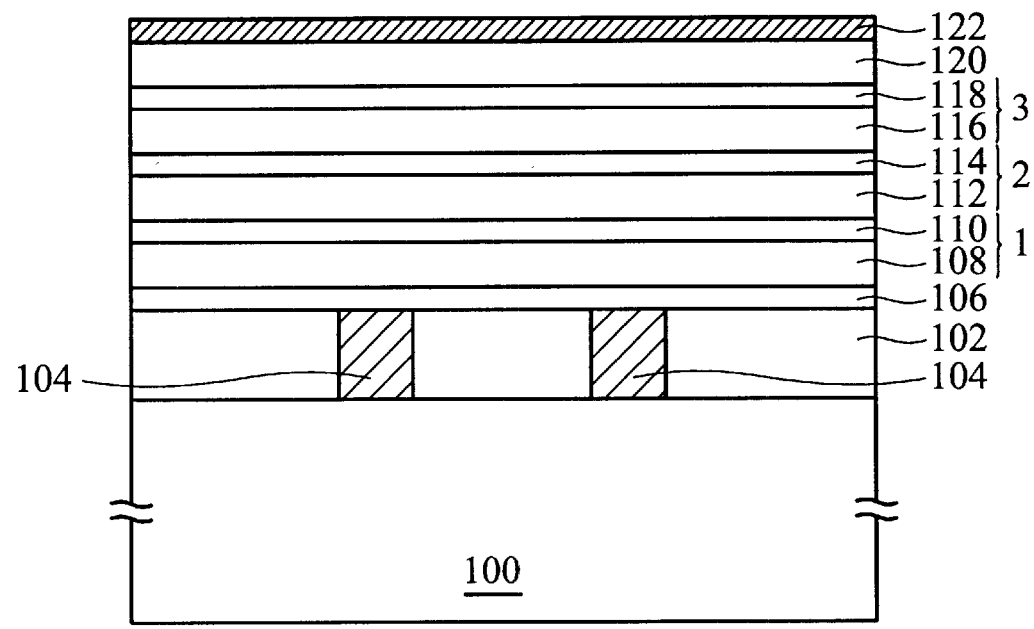

FIG. 2 to FIG. 4 are cross-sections showing the steps of forming a stacked dielectric layer on a semiconductor substrate according to the invention.

As shown in FIG. 2, a semiconductor substrate 100 of single-crystalline silicon is provided. Various semiconductor devices, such as resistors, conductors, and transistors (for clarity, not shown) are formed on the semiconductor substrate 100. Metal patterns 104 for example of copper are then formed in an inter-metal-dielectric (IMD) layer 102 followed by the deposition of a sealing layer 106 consisting of silicon oxy-nitride. The sealing layer 106 can serve as protective layer and the etching stop layer in the subsequent processes.

Next, as shown in FIG. 3, a composite layer 1, also called "a hybrid layer" is formed on the sealing layer 106. The composite layer 1 includes a first dielectric layer 108 having a thickness of about 1000 to about 1500 angstroms, and a second dielectric layer 110 having a thickness of about 300 to about 500 angstroms. The first dielectric layer has a relatively low dielectric constant (1.0 to 2.7), and a relatively low hardness (0.6 to 1.5 Gpa). On the other hand, the second dielectric layer 110 has a relatively high dielectric constant (3.0 to 5.0), a relatively high hardness (3.0 Gpa to 7.0 Gpa) Also, the first dielectric layer 108 is an inorganic silicon-based layer formed by a chemical vapor deposition (CVD) tool with multiple chambers. Preferably, The inorganic silicon-based layer consists of black diamond, or Coral manufactured by Applied Materials Corporation.

Alternately, spin-on polymers, such as aromatic hydrocarbon-based dielectric material (SilK) manufactured by Dow Chemical Corp, fluorinated poly (arylene ether) (FLARE) manufactured by Applied Signal Corporation, poly (arylene ether), or fluorine-doped silicon glass, can be used to replace the inorganic materials formed by CVD as mentioned above.

After, the second dielectric layer 110 is deposited on the first dielectric layer 108 in the same chemical vapor deposition tool by changing the reactant recipe. More preferably, the second dielectric layer 110 consists of silicon oxide, silicon nitride, silicon oxy-nitride, silicon carbide, or carbon doped silicon oxide.

A third dielectric layer 112 is formed on the second dielectric layer 110 as in the first dielectric layer 108. Similarly, the fourth dielectric layer 114 is formed as in the second dielectric layer 110 so as to generate a composite dielectric layer 2. Repeatedly, a fifth dielectric layer 116 and a sixth dielectric layer 118 are sequentially formed on the fourth dielectric layer 114 as in the first dielectric layer 108 and second dielectric layer 110 respectively. Therefore, a composite dielectric layer 3 is generated. Finally, a seventh dielectric layer 120 is formed on the sixth dielectric layer 118 as in the first dielectric layer 108. Accordingly, a stacked dielectric layer comprising the dielectric layers 108, 110, 112, 114, 116, 118 and 120 has more stable chemical and physical properties. Moreover, the adhesion between adjacent layers is from 70 Mpa to 90 Mpa.

Referring to FIG. 4, an anti-reflection layer 122 consisting of silicon oxy-nitride is then deposited on the composite dielectric layer 3 by the chemical vapor deposition tool mentioned above. A conventional via-first technology, comprising forming a via photoresist, forming a trench photoresist and etching, is used to form a dual damascene structure (not shown) in the subsequent step.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A method of forming a stacked dielectric layer on a semiconductor substrate having metal patterns, comprising the steps of:
   (a) forming a first dielectric layer on the semiconductor substrate wherein the first dielectric layer is a first layer of the stacked dielectric layer;
   (b) forming a second dielectric layer on the first dielectric layer to generate a composite dielectric layer, wherein the second dielectric layer has a dielectric constant (k) higher than that of the first dielectric layer, a hardness higher than that of the first dielectric layer, and a thickness less than that of the first dielectric layer; thereafter
   (c) forming a third dielectric layer on the second dielectric layer;
   (d) forming a fourth dielectric layer on the third dielectric layer, wherein the fourth dielectric layer has a dielectric constant (k) higher than that of the third dielectric layer, a hardness higher than that of the third dielectric layer, and a thickness less than that of the third dielectric layer;
   (e) forming a seventh dielectric layer on the fourth dielectric layer, wherein the fourth dielectric layer has a dielectric constant (k) higher than that of the seventh dielectric layer, a hardness higher than that of the seventh dielectric layer; and
   (f) selectively etching the seventh, the fourth, the third, the second, and the first dielectric layers to form a via hole of a dual damascene structure,
   wherein any adjacent dielectric layers have adhesion from 70 Mpa to 90 Mpa.

2. A method of forming a stacked dielectric layer on a semiconductor substrate having metal patterns as claimed in claim 1, further comprising a step of forming an anti-reflection layer consisting of silicon oxy-nitride after step (e) and before step (f).

3. A method of forming a stacked dielectric layer or a semiconductor substrate having metal patterns as claimed in claim 1, wherein each of the first dielectric layer, the third dielectric layer and the seventh dielectric layer is an organic material layer, having dielectric constant of 1.5 to 2.7, formed by spin coating.

4. A method of forming a stacked dielectric layer on a semiconductor substrate having metal patterns as claimed in claim 3, wherein each of the second dielectric layer and the fourth dielectric layer is an inorganic layer formed by chemical vapor deposition.

5. A method of forming a stacked dielectric layer or a semiconductor substrate having metal patterns as claimed in claim 1, wherein the first, second, third, fourth, and seventh dielectric layers are deposited by the same chemical vapor deposition too.

6. A method of forming a stacked dielectric layer on a semiconductor substrate having metal patterns as claimed in claim 1, wherein each of the first dielectric layer, the third dielectric layer, and the seventh dielectric layer has a thickness of about 1000 angstroms to about 1500 angstroms.

7. A method of forming a stacked dielectric layer on a semiconductor substrate having metal patterns as claimed in claim 6, wherein each of the second dielectric layer and the fourth dielectric layer has a thickness of about 300 angstroms to about 500 angstroms.

8. A method of forming a stacked dielectric layer on a semiconductor substrate having metal patterns as claimed in claim 1, wherein each of the first dielectric layer, the third dielectric layer, and the seventh dielectric layer has a hardness from 0.6 Gpa to 1.5 Gpa, and each of the second dielectric layer and the fourth dielectric layer has a hardness of 3 Gpa to 7 Gpa.

9. A method of forming a stacked dielectric layer on a semiconductor substrate having metal patterns as claimed in claim 1, wherein each of the second dielectric layer and the fourth dielectric layer has a dielectric constant (k) of 3 to 5.

10. A method of forming a stacked dielectric layer on a semiconductor substrate having metal patterns as claimed in claim 1, wherein each of the first dielectric layer, the third dielectric layer and the seventh dielectric layer is of aromatic hydrocarbon-based dielectric material (SilK) manufactured by Dow Chemical Corp, fluorinated poly (arylene ether) (FLARE) manufactured by Applied Signal Corporation, poly (arylene ether), or fluorine-doped silicon glass.

11. A method of forming a stacked dielectric layer on a semiconductor substrate having metal patterns as claimed in claim 1, wherein each of the second dielectric layer and the fourth dielectric layer is of silicon oxide, silicon nitride, silicon oxy-nitride, silicon carbide, or carbon doped silicon oxide.

12. A method of forming a stacked dielectric layer on a semiconductor substrate having metal patterns as claimed in claim 1, further comprising a step of forming a sealing layer between the upper surface of the semiconductor substrate having metal patterns and the first dielectric layer.

13. A method of forming a stacked dielectric layer on a semiconductor substrate having metal patterns as claimed in claim 12, wherein the sealing layer is of silicon oxy-nitride.

14. A method of forming a stacked dielectric layer on a semiconductor substrate having metal patterns as claimed in claim 1, wherein the formation of the dual damascene structure is created by a conventional via-first process.

15. A method of forming a stacked dielectric layer on a semiconductor substrate having metal patterns, comprising:
   forming a plurality of low dielectric constant (k) dielectric layers on the semiconductor substrate wherein a first layer of the stacked dielectric layer is one of the low dielectric constant dielectric layers;
   forming a sealing layer between the low dielectric constant (k) dielectric layers and the semiconductor substrate;
   forming a plurality of high hardness dielectric layers, each disposed between two adjacent low dielectric constant (k) dielectric layers;
   forming an anti-reflection layer on the utmost low dielectric constant (k) dielectric layer;
   selectively etching the stacked dielectric layer of the low dielectric constant (k) dielectric layers, the high hardness dielectric layers, the sealing layer and the anti-reflection layer to form a via hole of a dual damascene structure,
   wherein each low dielectric constant (k) dielectric layer has a thickness of about 1000 angstroms to about 1500 angstroms, and each high hardness dielectric layer has a hardness of 3 Gpa to 7 Gpa.

16. A method of forming a stacked dielectric layer on a semiconductor substrate having metal patterns as claimed in claim 15, wherein each high hardness dielectric layer has a thickness of about 300 angstroms to about 500 angstroms.

17. A method of forming a stacked dielectric layer on a semiconductor substrate having metal pasterns as claimed in claim 15, wherein each low dielectric constant (k) dielectric layer has a dielectric constant (k) of 1.5 to 2.7 and a hardness from 0.6 Gpa to 1.5 Gpa.

18. A method of forming a stacked dielectric layer on a semiconductor substrate having metal patterns as claimed in claim 15, wherein adhesion between each low dielectric constant (k) dielectric layer and each high hardness dielectric layer is from 70 Mpa to 90 Mpa.

19. A method of forming a stacked dielectric layer on a semiconductor substrate having metal patterns as claimed in claim 15, wherein the number of the low dielectric constant (k) layers Is four, and the number of the high hardness dielectric layer Is three.

* * * * *